US011926896B2

United States Patent
Wesslin et al.

(10) Patent No.: US 11,926,896 B2
(45) Date of Patent: Mar. 12, 2024

(54) ATOMIC LAYER DEPOSITION APPARATUS

(71) Applicant: BENEQ OY, Espoo (FI)

(72) Inventors: Johannes Wesslin, Espoo (FI); Pekka Soininen, Espoo (FI); Jonas Andersson, Espoo (FI)

(73) Assignee: BENEQ OY, Espoo (FI)

( * ) Notice: Subject to any disclaimer, the term of this patent is extended or adjusted under 35 U.S.C. 154(b) by 0 days.

(21) Appl. No.: 18/475,355

(22) Filed: Sep. 27, 2023

(65) Prior Publication Data

US 2024/0018652 A1 Jan. 18, 2024

Related U.S. Application Data

(63) Continuation of application No. PCT/FI2022/050202, filed on Mar. 29, 2022.

(30) Foreign Application Priority Data

Mar. 30, 2021 (FI) .................................... 20215374

(51) Int. Cl.
*C23C 16/455* (2006.01)

(52) U.S. Cl.
CPC .. *C23C 16/45544* (2013.01); *C23C 16/45561* (2013.01); *C23C 16/45563* (2013.01); *C23C 16/45582* (2013.01)

(58) Field of Classification Search
CPC ........ C23C 16/45544; C23C 16/45561; C23C 16/45563; C23C 16/45582
See application file for complete search history.

(56) References Cited

U.S. PATENT DOCUMENTS

| 5,855,680 A | 1/1999 | Soininen et al. |
| 2006/0137608 A1 | 6/2006 | Choi et al. |

(Continued)

FOREIGN PATENT DOCUMENTS

WO   WO-2022207975 A1 * 10/2022

OTHER PUBLICATIONS

International Search Report issued by the Finnish Patent and Registration Office acting as the International Searching Authority in relation to International Application No. PCT/FI2022/050202 dated Aug. 9, 2022 (4 pages).

(Continued)

*Primary Examiner* — Jeffrie R Lund
(74) *Attorney, Agent, or Firm* — Robert P. Michal, Esq.; Carter, DeLuca & Farrell LLP

(57) ABSTRACT

An atomic layer deposition apparatus having a reaction chamber arranged inside a vacuum chamber and a fixed gas manifold assembly fixedly provided to the atomic layer deposition apparatus and arranged to supply gases from outside the vacuum chamber to the reaction chamber. The reaction chamber is a movable reaction chamber which is arranged movable relative to the vacuum chamber and relative to the fixed gas manifold assembly. The atomic layer deposition apparatus further includes a connection arrangement coupling the movable reaction chamber to the fixed gas manifold assembly. The connection arrangement includes a flexible outer flange assembly surrounding the fixed gas manifold assembly, and a first connection surface connecting to a second connection surface of the reaction chamber.

12 Claims, 4 Drawing Sheets

(56) References Cited

U.S. PATENT DOCUMENTS

2010/0129548 A1    5/2010   Sneh
2012/0067284 A1    3/2012   Soininen et al.
2019/0390339 A1   12/2019   Malinen

OTHER PUBLICATIONS

Written Opinion of the International Searching Authority issued by the Finnish Patent and Registration Office acting as the International Searching Authority in relation to International Application No. PCT/FI2022/050202 dated Aug. 9, 2022 (5 pages).
Finnish Search Report issued by the Finnish Patent and Registration Office in relation to Finnish Application No. 20215374 dated Oct. 29, 2021 (1 page).

\* cited by examiner

ATOMIC LAYER DEPOSITION APPARATUS

CROSS-REFERENCE TO RELATED APPLICATIONS

This application is a continuation of PCT International Application No. PCT/FI2022/050202 filed Mar. 29, 2022, which claims priority to Finnish Patent Application No. 20215374, filed Mar. 30, 2021, the disclosure of each of these applications is expressly incorporated herein by reference in their entirety.

FIELD OF THE INVENTION

The present invention relates to an atomic layer deposition apparatus.

BACKGROUND OF THE INVENTION

In the prior art atomic layer deposition apparatuses, the reaction chambers are typically static, and the gas manifolds are fixedly connected to the reaction chambers. However, there are also movable reaction chambers but the gas connections between the reaction chamber and the gas manifold requires manual connection by the user.

The invention relates to large atomic layer deposition machines in which the length of the machine can be over 4 metres and the width of a substrate processed in the reaction chamber can be over one metre. Therefore, feeding and discharge tube diameters can be even 250 mm. This size of tube parts are very heavy, and they are located inside the large machine which makes it difficult to clean or change the parts when they get dirty.

BRIEF DESCRIPTION OF THE INVENTION

An object of the present invention is to provide an atomic layer deposition apparatus which solves the problems described above.

The objects of the invention are achieved by an atomic layer deposition apparatus which is characterized by what is stated in the independent claim. The preferred embodiments of the invention are disclosed in the dependent claims.

The invention is based on the idea of providing a flexible connection between a reaction chamber and a fixed gas manifold assembly which the flexible connection reacts to the movements of the reaction chamber and keeps the connection between the reaction chamber and the fixed gas manifold assembly tight.

An atomic layer deposition apparatus according to the invention has a reaction chamber arranged inside a vacuum chamber and a fixed gas manifold assembly fixedly provided to the atomic layer deposition apparatus and arranged to supply gases from outside the vacuum chamber to the reaction chamber. The reaction chamber is a movable reaction chamber which is arranged movable relative to the vacuum chamber and relative to the fixed gas manifold assembly. The atomic layer deposition apparatus further comprises a connection arrangement coupling the movable reaction chamber to the fixed gas manifold assembly. The connection arrangement comprises a flexible outer flange assembly surrounding the fixed gas manifold assembly, and a first connection surface connecting to a second connection surface of the reaction chamber.

According to the invention the flexible outer flange assembly is arranged coaxially around the fixed gas manifold assembly such that the flexible outer flange assembly and the fixed gas manifold assembly have a coaxial clearance forming a gas channel between the flexible outer flange assembly and the fixed gas manifold assembly.

According to the invention the flexible outer flange assembly comprises a first connection portion having the first connection surface, a second connection portion attached to the fixed gas manifold assembly, and a flexible connection portion connecting the first connection portion and the second connection portion together such that the first connection portion is movable relative to the second connection portion.

According to the invention the flexible connection portion comprises an expansion member connected to the first connection portion and the second connection portion and surrounding the fixed gas manifold assembly. The expansion member is extending between the first connection portion and the second connection portion, which together forming a gas-tight wall around the fixed gas manifold assembly. The expansion member is arranged to contract when the first connection surface and the second connection surface connect together and to expand when there is no pressing connection between the fixed gas manifold structure and the reaction chamber.

According to the invention the expansion member is a bellow structure.

According to the invention the flexible connection portion further comprises a flexible part connected to the first connection portion and the second connection portion and separated from the expansion member. The flexible part is arranged to expand and contract according to the contact between the first connection surface of the flexible outer flange assembly and the second connection surface of the reaction chamber for keeping the contact tight.

According to the invention the flexible part comprises preloaded springs extending between the first connection portion and the second connection portion.

According to the invention the flexible part is arranged to provide a vertical movement for the first connection surface. Alternatively, the flexible part is arranged to provide a tilting movement for the first connection surface. Alternatively, the flexible part is arranged to provide a vertical movement and a tilting movement for the first connection surface.

According to the invention the fixed gas manifold assembly comprises a housing structure enclosing rigid gas pipes extending within the housing structure from a gas unit to an end surface of the housing structure.

According to the invention the vacuum chamber and the fixed gas manifold assembly are fixed together, and the fixed gas manifold assembly is arranged to extend from outside the vacuum chamber through a wall of the vacuum chamber into the vacuum chamber, the connection arrangement is provided within the vacuum chamber.

According to the invention the atomic layer deposition apparatus comprises multiple fixed gas manifold assemblies fixedly provided to the atomic layer deposition apparatus such that a first fixed gas manifold assembly is arranged to supply gases from outside the vacuum chamber to the reaction chamber and a second fixed gas manifold assembly is arranged to discharge gases from the reaction chamber to outside the vacuum chamber. The atomic layer deposition apparatus further comprises a gas source for providing gases to the reaction chamber through the first fixed gas manifold assembly, and a discharge device for discharging gases from the reaction chamber through the second fixed gas discharge manifold assembly. The connection arrangement is provided in connection with each of the fixed gas manifold assemblies for coupling the movable reaction chamber to the fixed gas manifold assemblies.

An advantage of the invention is that even though the reaction chamber is arranged movable relative to the fixed gas manifold assembly, the connection between them can be made tight because of the connection arrangement having the flexible outer flange assembly. Further advantage of the invention is that the outer surface of the fixed gas manifold structure can be kept clean because of the gas channel provided in the coaxial clearance formed between the fixed gas manifold assembly and the connection arrangement in which inert gas like nitrogen can be fed.

BRIEF DESCRIPTION OF THE DRAWINGS

The invention is described in detail by means of specific embodiments with reference to the enclosed drawings, in which.

DETAILED DESCRIPTION OF THE INVENTION

Figure 1:
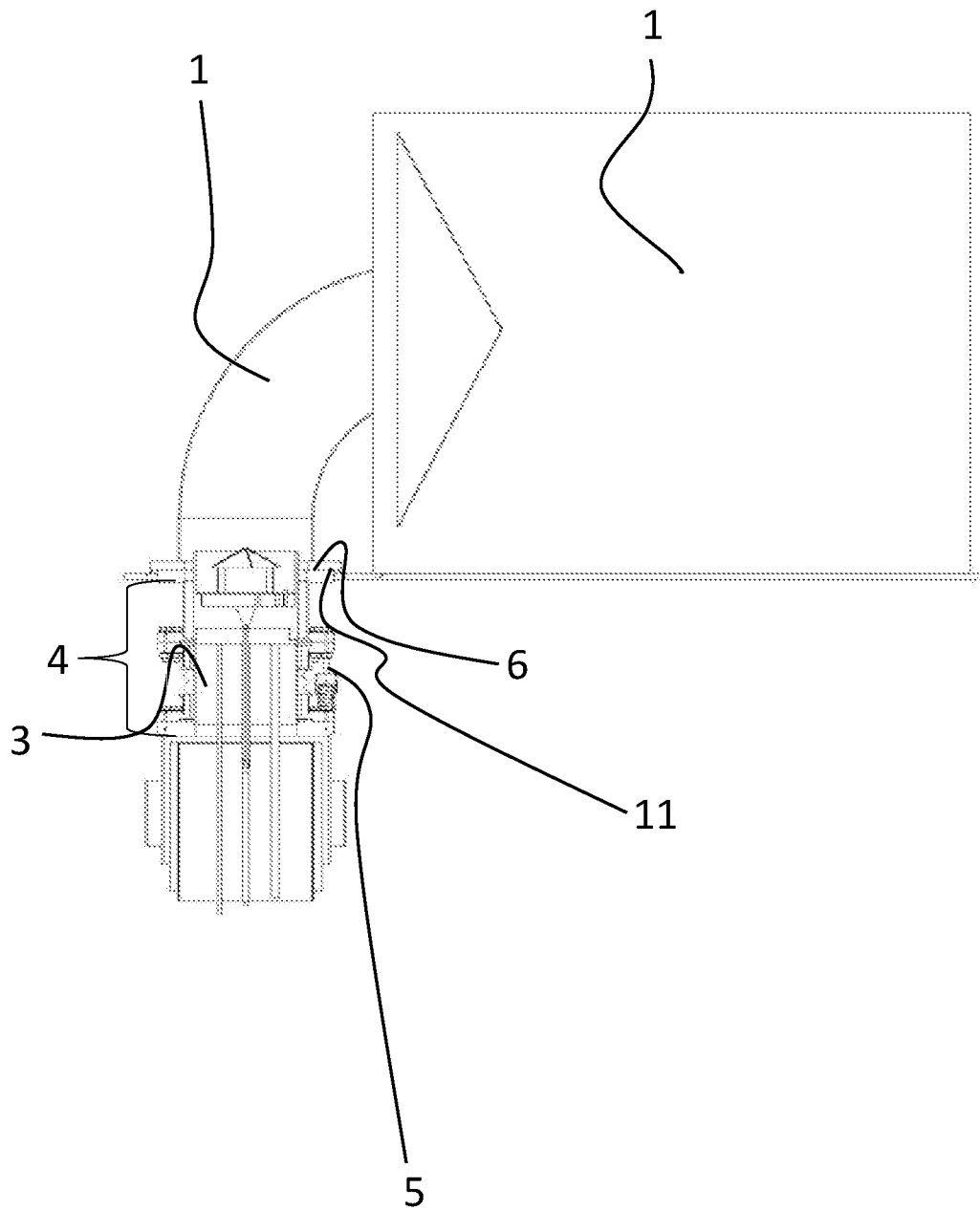
FIG. 1 shows a detail of an atomic layer deposition apparatus according to the invention.

FIG. 1 shows a detail of an atomic layer deposition apparatus according to the invention having a reaction chamber 1 arranged inside a vacuum chamber. The reaction chamber 1 comprises a supply connected from a fixed gas manifold assembly 3. The reaction chamber 1 shown in FIG. 1 is arranged on rails such that the reaction chamber 1 is movable relative to the vacuum chamber such that the reaction chamber 1 can be moved out from the vacuum chamber and again into the vacuum chamber. Therefore, the reaction chamber 1 is also movable relative to the fixed gas manifold assembly 3 which is provided in connection with the vacuum chamber. Thus, the reaction chamber 1 is a movable reaction chamber 1. The atomic layer deposition apparatus further comprises a connection arrangement 4 coupling the movable reaction chamber 1 to the fixed gas manifold assembly 3. As the movable reaction chamber 1 is moved relative to the vacuum chamber and the fixed gas manifold remains in its fixed position in connection with the vacuum chamber, connecting the movable reaction chamber 1 and the fixed gas manifold 3 is provided through the connection arrangement 4 comprising a flexible outer flange assembly 5 surrounding the fixed gas manifold assembly and a first connection surface 6 connecting to a second connecting surface 11 of the reaction chamber 1. The flexible outer flange assembly 5 provides up and down movements of the first connection surface 6 as well as tilting movement of the first connection surface 6 relative to the reaction chamber 1 when the coupling between the fixed gas manifold assembly 3 and the reaction chamber 1 is carried out. The reaction chamber 1 is far too heavy to be aligned according to the fixed gas manifold assembly 3 whereas the fixed gas manifold assembly cannot be moved since it is fixed to the atomic layer deposition apparatus. The first connection surface 6 will be pressed toward the second connection surface 11 of the reaction chamber 1 so that the connection between the fixed gas manifold assembly 3 and the reaction chamber 1 is tight and gases do not escape outside the connection to the vacuum chamber. The fixed gas manifold assembly 3 is fixedly provided to the atomic layer deposition apparatus such that it is arranged to supply gases from a gas source provided outside the vacuum chamber to the reaction chamber 1.

Figure 2:
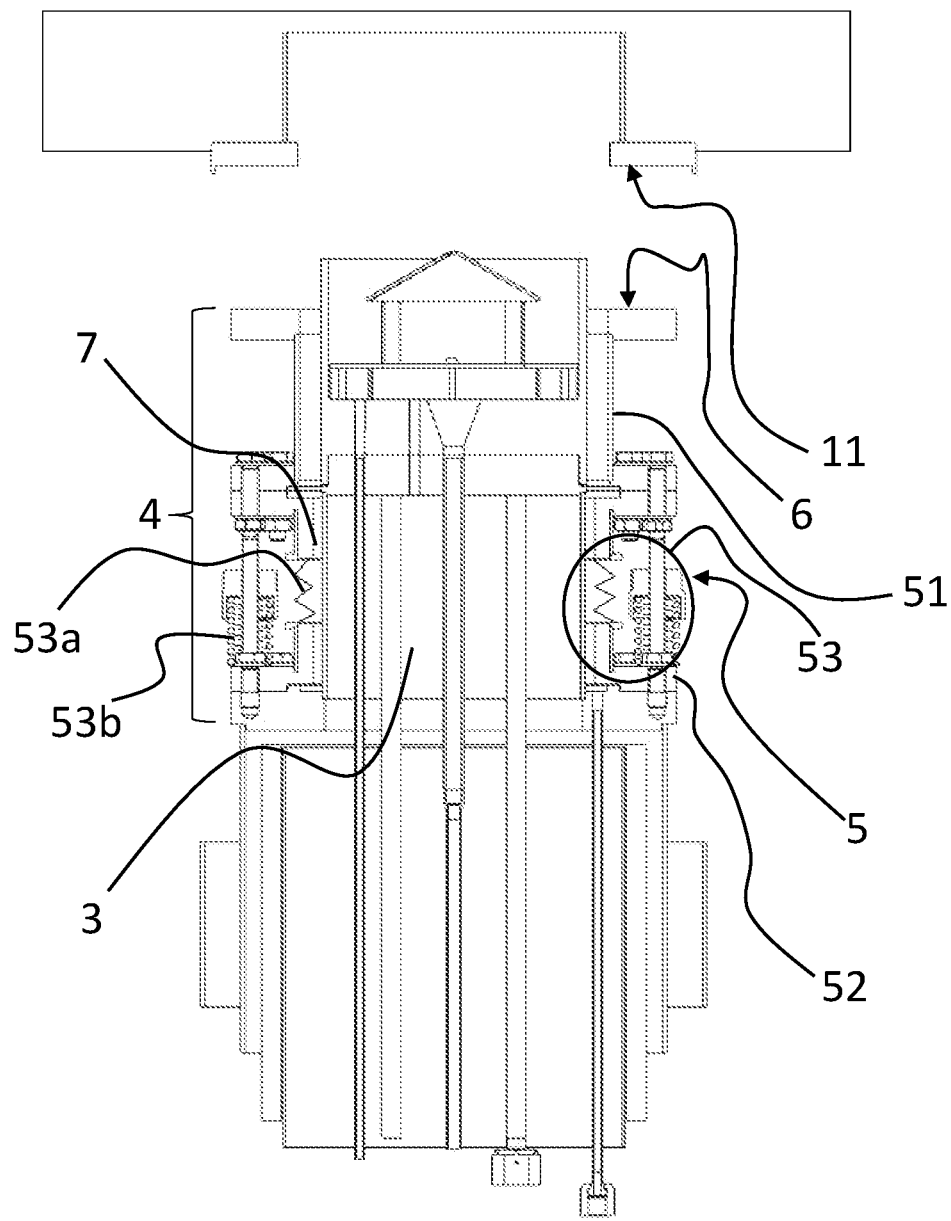
FIG. 2 shows a connection arrangement according to the invention in one position.

FIG. 2 shows a connection arrangement 4 according to the invention in one position in which the first connection surface 6 is at a distance from the second connection surface 11 of the reaction chamber 1. In other words, the FIG. 2 shows a state of the atomic layer deposition apparatus in which the connection between the reaction chamber 1 and the fixed gas manifold assembly 3 is not formed yet and precursors supplied from the fixed gas manifold assembly 3 would escape to the vacuum chamber. The FIG. 2 shows the details of the connection arrangement 4 of the atomic layer deposition apparatus provided to form a connection between the reaction chamber 1 and the fixed gas manifold assembly 3. The connection arrangement 4 comprises the first connection surface 6 which is arranged to be connected to the second connection surface 11 of the reaction chamber 1. The first connection surface 6 is movable towards the second connection surface 11 as the movable reaction chamber 1 is provided at its place in the vacuum chamber. The first connection surface 6 moves as a response of a movement of the flexible outer flange assembly 5 surrounding the fixed gas manifold assembly 3. The flexible outer flange assembly 5 comprises a first connection portion 51 having the first connection surface 6, a second connection portion 52 attached to the fixed gas manifold assembly 3, and a flexible connection portion 53 connecting the first connection portion 51 and the second connection portion 52 together such that the first connection portion 51 is movable relative to the second connection portion 52. The flexible connection portion 53 provides the up and down movement of the first connection surface 6 relative to the second connection surface 11 and a tilting movement when the reaction chamber 1 and the fixed gas manifold structure need to be aligned.

FIG. 2 further shows that the flexible connection portion 53 comprises an expansion member 53a connected to the first connection portion 51 and the second connection portion 52 and surrounding the fixed gas manifold assembly 3. The expansion member 53a is extending between the first connection portion 51 and the second connection portion 52, which together forming a gas-tight wall around the fixed gas manifold assembly 3. In other words, the part of the first connection portion 51 and the part of the second connection portion 52 which surround closest the fixed gas manifold assembly 3 form together with the expansion member 53a an outer wall to a gas channel 7 extending around the around the fixed gas manifold assembly 3. The gas channel 7 is for providing inert gas which prevents precursor gases to enter back to the structures of the gas manifold assembly 3 from the connection point of the fixed gas manifold assembly and the reaction chamber 1. The expansion member 53a surrounds the fixed gas manifold assembly 3 in order to provide a gastight structure together with the first connection portion 51 and the second connection portion 52. The expansion member 53a is in this embodiment of the invention a bellow structure.

The flexible connection portion 53 further comprises a flexible part 53b connected to the first connection portion 51 and the second connection portion 52 and separated from the expansion member 53a. The flexible part 53b is arranged to expand and contract according to the contact between the first connection surface of the flexible outer flange assembly 5 and the second connection surface 11 of the reaction chamber 1 for keeping the contact tight. The flexible part 53b is in this embodiment of the invention a spring. Although the figure shows only two springs the flexible outer flange assembly 5 is provided coaxially around the fixed gas manifold assembly 3 and therefore the flexible parts 53b are also provide around the fixed gas manifold assembly 3 in certain intervals.

Figure 3:
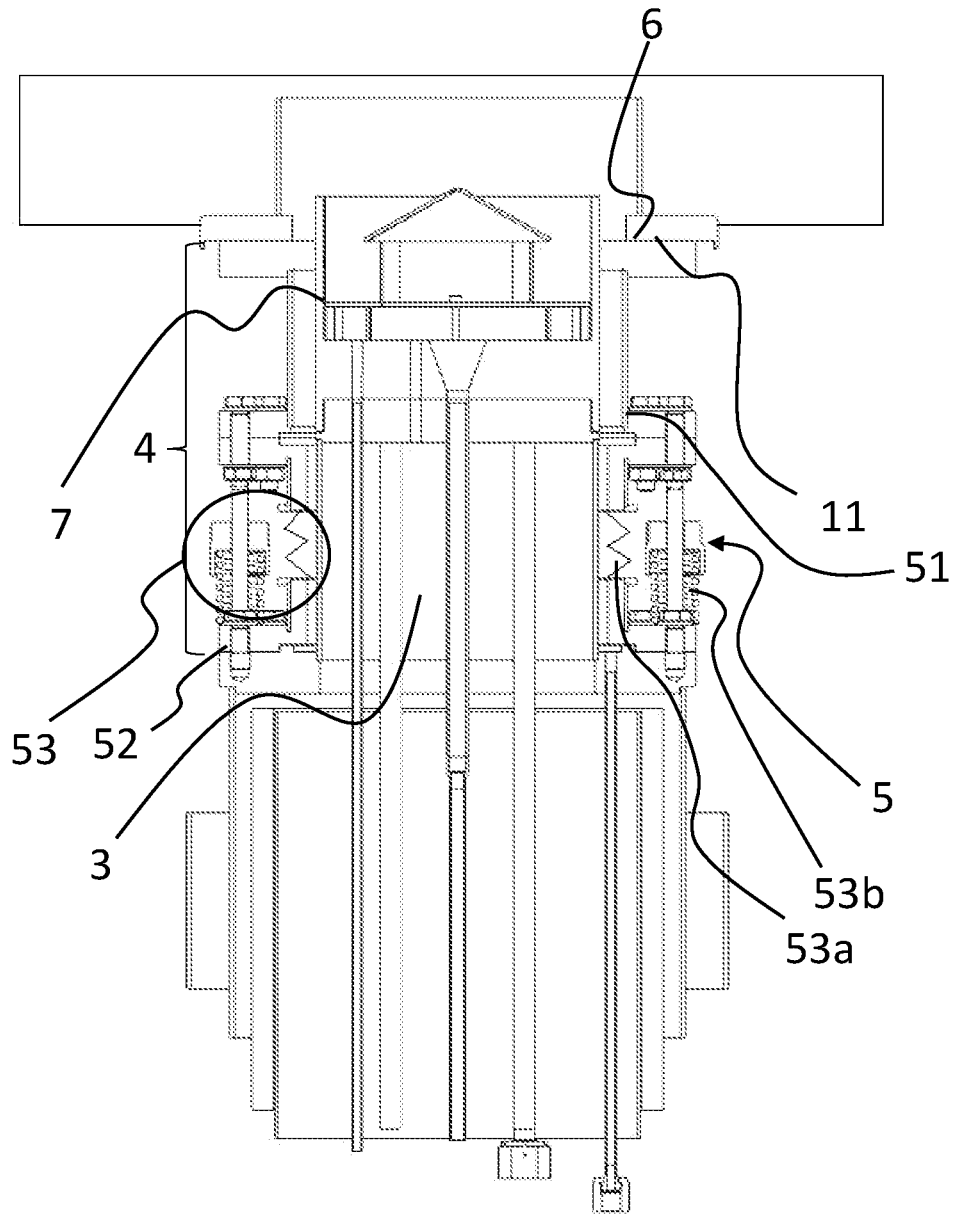
FIG. 3 shows a connection arrangement according to the invention in another position.

FIG. 3 shows a connection arrangement according to the invention in another position in which the first connection surface 6 and the second connection surface 11 are against each other such that the connection between the reaction chamber 2 and the fixed gas manifold assembly 3 is established and a flow connection between the reaction chamber 2 and the fixed gas manifold assembly 3 to the vacuum chamber is closed. The gas channel 7 formed by the coaxial clearance between the fixed gas manifold assembly 3 and the connection arrangement 4 is arranged to supply inert gas around the fixed gas manifold assembly 3 for arranging a diffusion barrier to keep film deposition out from the outer structures. The precursor gases are supplied through the gas channels of the fixed gas manifold assembly 3. As the first surface 6 of the connection arrangement 4 and the second surface 11 of the reaction chamber 2 are tightly connected to each other the flexible outer flange assembly 5 surrounding the fixed gas manifold assembly 3 is activated such that the flexible part 53b pushes the first surface 6 toward the second surface 11 for keeping the connection between the surfaces tight, and the expansion member 53a adjusts to an expansion or to a contract of the flexible part 53b so that the gas channel 7 around the fixed gas manifold assembly 3 is gas tight.

Figure 4:
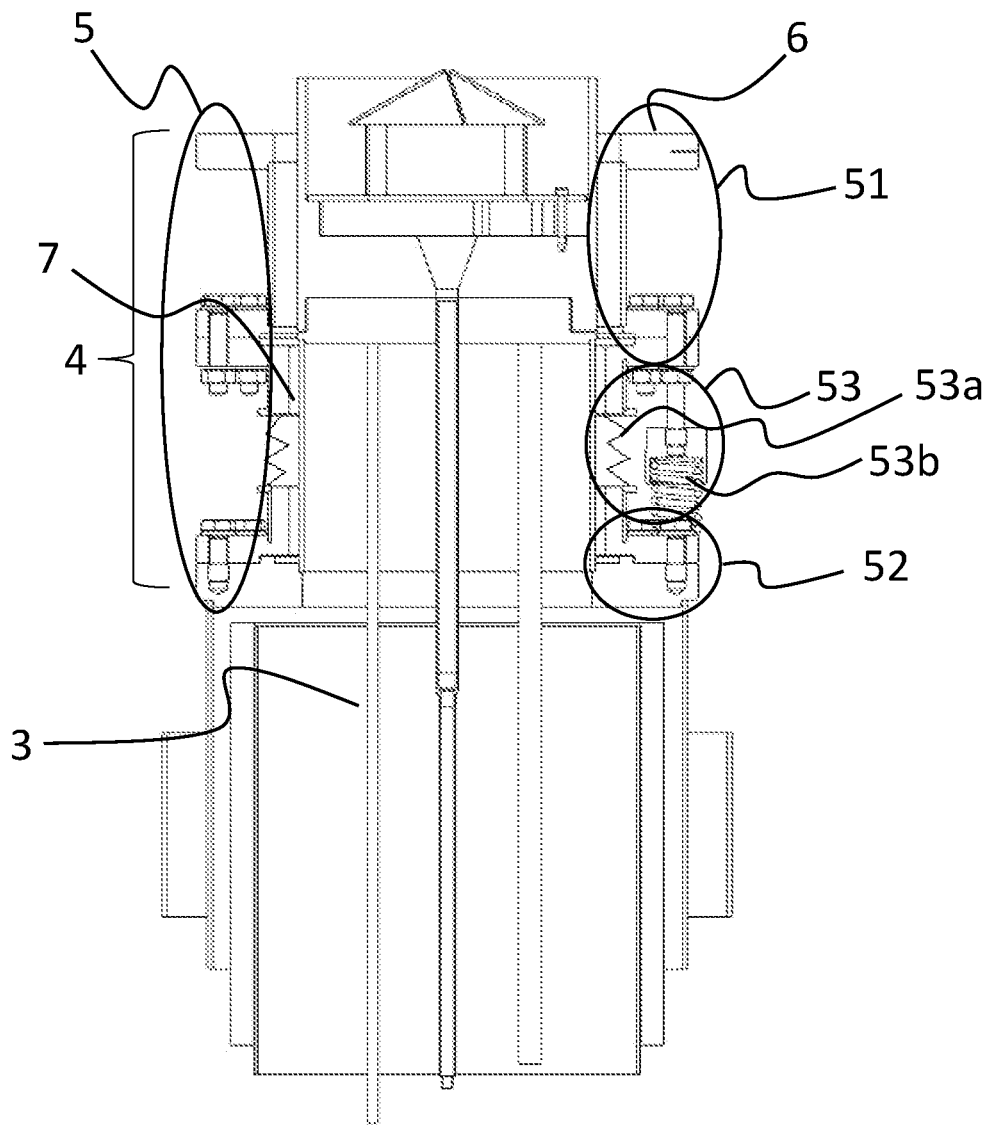
FIG. 4 shows a connection arrangement according to the invention.

FIG. 4 shows the connection arrangement 4 according to the invention in more detail. The connection arrangement 4 comprises the first connection surface 6 and the flexible outer flange assembly 5. The flexible outer flange assembly 5 comprises a first connection portion 51, a second connection portion 52 and a flexible connection portion 53 between the first connection portion 51 and the second connection portion 52. The first connection surface 6 is provided to the first connection portion 51. The second connection portion 52 is attached to the fixed gas manifold assembly 3 and the flexible connection portion 53 is connected to the second connection portion 52 connecting the first connection portion 51 to the second connection portion 52 through the flexible connection portion 53. As the flexible connection portion 53 expands or contracts the first connection surface 6 moves according to the movement of the flexible connection portion 53. The flexible connection portion 53 also allows tilting movement so that when the second connection surface 11 of the reaction chamber 1 meets the first connection surface 6 in an angle relative to the first connection surface 6 the connection between the first connection surface 6 and the second connection surface 11 becomes tight because of tilting of the first connection surface 6 according to the position of the second connection surface 11.

The FIG. 4 shows a preloaded spring which forms the flexible part 53b, however the expansion member 53a is omitted from the figure to show that the first connection portion 51 and the second connection portion 52 both comprise a surface against which the expansion part is arranged.

The invention has been described above with reference to the examples shown in the figures. However, the invention is in no way restricted to the above examples but may vary within the scope of the claims.

The invention claimed is:

1. An atomic layer deposition apparatus having a reaction chamber disposed inside a vacuum chamber and a fixed gas manifold assembly fixedly provided to the atomic layer deposition apparatus and configured to supply gases from outside the vacuum chamber to the reaction chamber, wherein the reaction chamber is a movable reaction chamber which is configured to be movable relative to the vacuum chamber and relative to the fixed gas manifold assembly, the atomic layer deposition apparatus further comprises:
   a connection arrangement coupling the movable reaction chamber to the fixed gas manifold assembly, the connection arrangement comprises:
   a flexible outer flange assembly surrounding the fixed gas manifold assembly, and
   a first connection surface connecting to a second connection surface of the reaction chamber.

2. The atomic layer deposition apparatus according to claim 1, wherein the flexible outer flange assembly is configured coaxially around the fixed gas manifold assembly such that the flexible outer flange assembly and the fixed gas manifold assembly have a coaxial clearance forming a gas channel between the flexible outer flange assembly and the fixed gas manifold assembly.

3. The atomic layer deposition apparatus according to claim 1, wherein the flexible outer flange assembly comprises:
   a first connection portion having the first connection surface,
   a second connection portion operatively coupled to the fixed gas manifold assembly, and
   a flexible connection portion connecting the first connection portion and the second connection portion together such that the first connection portion is movable relative to the second connection portion.

4. The atomic layer deposition apparatus according to claim 3, wherein the flexible connection portion is configured to provide a vertical movement for the first connection surface; or
   the flexible connection portion is configured to provide a tilting movement for the first connection surface; or
   the flexible connection portion is configured to provide a vertical movement and a tilting movement for the first connection surface.

5. The atomic layer deposition apparatus according to claim 3, wherein the flexible connection portion comprises:
   an expansion member operatively coupled to the first connection portion and the second connection portion and surrounding the fixed gas manifold assembly, the expansion member is extending between the first connection portion and the second connection portion, which together forming a gas-tight wall around the fixed gas manifold assembly.

6. The atomic layer deposition apparatus according to claim 5, wherein the expansion member is a bellow structure.

7. The atomic layer deposition apparatus according to claim 5, wherein the flexible connection portion further comprises:
   a flexible part operatively coupled to the first connection portion and the second connection portion and separated from the expansion member, the flexible part being arranged to expand and contract according to the contact between the first connection surface of the flexible outer flange assembly and the second connection surface of the reaction chamber for keeping the contact tight.

8. The atomic layer deposition apparatus according to claim 7, wherein the flexible part comprises preloaded springs extending between the first connection portion and the second connection portion.

9. The atomic layer deposition apparatus according to claim 7, wherein the flexible part is configured to provide a vertical movement for the first connection surface; or
the flexible part is configured to provide a tilting movement for the first connection surface; or
the flexible part is configured to provide a vertical movement and a tilting movement for the first connection surface.

10. The atomic layer deposition apparatus according to claim 1, wherein the fixed gas manifold assembly comprises a housing structure enclosing rigid gas pipes extending within the housing structure from a gas unit to an end surface of the housing structure.

11. The atomic layer deposition apparatus according to claim 1, wherein the vacuum chamber and the fixed gas manifold assembly are fixed together and the fixed gas manifold assembly is configured to extend from outside the vacuum chamber through a wall of the vacuum chamber into the vacuum chamber, the connection arrangement is provided within the vacuum chamber.

12. The atomic layer deposition apparatus according to claim 1, wherein the atomic layer deposition apparatus comprises multiple fixed gas manifold assemblies fixedly provided to the atomic layer deposition apparatus such that a first fixed gas manifold assembly is arranged to supply gases from outside the vacuum chamber to the reaction chamber and a second fixed gas manifold assembly is arranged to discharge gases from the reaction chamber to outside the vacuum chamber, the atomic layer deposition apparatus further comprises:
   a gas source for providing gases to the reaction chamber through the first fixed gas manifold assembly, and
   a discharge device for discharging gases from the reaction chamber through the second fixed gas discharge manifold assembly,
   the connection arrangement is provided in connection with each of the fixed gas manifold assemblies for coupling the movable reaction chamber to the fixed gas manifold assemblies.

* * * * *